United States Patent
Wu et al.

(10) Patent No.: US 11,632,090 B1
(45) Date of Patent: Apr. 18, 2023

(54) PUSH-PUSH FREQUENCY DOUBLING SCHEME AND CIRCUIT BASED ON COMPLEMENTARY TRANSISTORS

(71) Applicant: THE CHINESE UNIVERSITY OF HONG KONG, SHENZHEN, Shenzhen (CN)

(72) Inventors: Liang Wu, Shenzhen (CN); Xiaoping Wu, Shenzhen (CN); Yihui Wang, Shenzhen (CN)

(73) Assignee: THE CHINESE UNIVERSITY OF HONG KONG, SHENZHEN, Shenzhen (CN)

( * ) Notice: Subject to any disclaimer, the term of this patent is extended or adjusted under 35 U.S.C. 154(b) by 0 days.

(21) Appl. No.: 17/891,249

(22) Filed: Aug. 19, 2022

Related U.S. Application Data

(63) Continuation of application No. PCT/CN2021/139748, filed on Dec. 20, 2021.

(51) Int. Cl.
*H03F 3/45* (2006.01)

(52) U.S. Cl.
CPC .......... *H03F 3/45179* (2013.01); *H03F 2200/451* (2013.01)

(58) Field of Classification Search
CPC .......................................... H03F 3/45
(Continued)

(56) References Cited

U.S. PATENT DOCUMENTS

| | | | |
|---|---|---|---|
| 8,410,854 B2* | 4/2013 | Deguchi | H03F 3/3028 330/296 |
| 2012/0154045 A1* | 6/2012 | Tsai | H03F 3/72 330/253 |

(Continued)

FOREIGN PATENT DOCUMENTS

| | | |
|---|---|---|
| CN | 103731103 A | 4/2014 |
| CN | 107634722 A | 1/2018 |

(Continued)

OTHER PUBLICATIONS

Behzad Razavi, A 60-GHz CMOS Receiver Front-End, IEEE Journal of Solid-State Circuits, 2006, pp. 17-22, vol. 41, No. 1.

(Continued)

*Primary Examiner* — Henry Choe
(74) *Attorney, Agent, or Firm* — Bayramoglu Law Offices LLC

(57) ABSTRACT

A push-push frequency doubler based on complementary transistors is provided. The first differential amplifier circuit receives a differential input signal having an initial frequency, and amplifies the amplitude of the second harmonic of the differential input signal to obtain a first signal. The second differential amplifier circuit receives the differential input signal with the initial frequency and amplifies the amplitude of the second harmonic of the differential input signal to obtain the second signal. Where, the first signal and the second signal are a set of differential signals with the same amplitude and a phase difference of 180°. The output load circuit extracts the second harmonic signal in the first and second signal respectively to obtain and output a pair of differential output signal with first output frequency whose value is twice of the initial frequency. As a result, the frequency doubler with differential output signal is realized.

15 Claims, 13 Drawing Sheets

(58) Field of Classification Search
USPC .................................................. 330/253, 261
See application file for complete search history.

(56) References Cited

U.S. PATENT DOCUMENTS

2014/0003162 A1* 1/2014 Cho .................... H03F 3/45179
330/253
2016/0043697 A1* 2/2016 Uppathil ............. H04L 27/3809
375/345

FOREIGN PATENT DOCUMENTS

CN 109617530 A 4/2019
CN 111313892 A 6/2020
CN 112615590 A 4/2021

OTHER PUBLICATIONS

Scott K. Reynolds, et al., A Silicon 60-GHz Receiver and Transmitter Chipset for Broadband Communications, IEEE Journal of Solid-State Circuits, 2006, pp. 2820-2831, vol. 41, No. 12.
Cristian Marcu, et al., A 90 nm CMOS Low-Power 60 GHz Transceiver With Integrated Baseband Circuitry, IEEE Journal of Solid-State Circuits, 2009, pp. 3434-3447, vol. 44, No. 12.
Daihyun Lim, et al., Performance Variability of a 90GHz Static CML Frequency Divider in 65nm SOI CMOS, IEEE International Solid-State Circuits Conference, 2007, pp. 542-543, 621.
Jingjing Chen, et al., Does LO Noise Floor Limit Performance in Multi-Gigabit Millimeter-Wave Communication?, IEEE Microwave and Wireless Components Letters, 2017, pp. 769-771, vol. 27, No. 8.
Austin Ying-Kuang Chen, et al., A 36-80 GHz High Gain Millimeter-Wave Double-Balanced Active Frequency Doubler in SiGe BiCMOS, IEEE Microwave and Wireless Components Letters, 2009, pp. 572-574, vol. 19, No. 9.
Gang Liu, et al., 60-80 GHz Frequency Doubler Operating Close to fmax, Proceedings of Asia-Pacific Microwave Conference, TH2E-1, 2010, pp. 770-773.
Sudipta Chakraborty, et al., A K-Band Frequency Doubler With 35-dB Fundamental Rejection Based on Novel Transformer Balun in 0.13-μm SiGe Technology, IEEE Electron Device Letters, 2016, pp. 1375-1378, vol. 37, No. 11.

Enrico Monaco, et al., Injection-Locked CMOS Frequency Doublers for μ-Wave and mm-Wave Applications, IEEE Journal of Solid-State Circuits, 2010, pp. 1565-1574, vol. 45, No. 8.
Frank Ellinger, et al., Ultracompact SOI CMOS Frequency Doubler for Low Power Applications at 26.5-28.5 GHz, IEEE Microwave and Wireless Components Letters, 2004, pp. 53-55, vol. 14, No. 2.
Vincent Rieß, et al., Analysis and Design of a 60 GHz Fully-Differential Frequency Doubler in 130 nm SiGe BiCMOS, IEEE, 2018.
Michael Möller, Challenges in the Cell-Based Design of Very-High-Speed SiGe-Bipolar ICs at 100 GB/s, IEEE Journal of Solid-State Circuits, 2008, pp. 1877-1888, vol. 43, No. 9.
Soenke Vehring, et al., Truly Balanced K-Band Push-Push Frequency Doubler, 2018 IEEE Radio Frequency Integrated Circuits Symposium, RTUIF-8, 2018, pp. 348-351.
Vincent Rieß, et al., A 60 GHz Frequency Doubler with Differential Output in 130 nm SiGe BiCMOS Technology, Proceedings of 2018 Asia-Pacific Microwave Conference, WE1-IF-09, 2018, pp. 279-281.
Christopher Coen, et al., A Highly-Efficient 138-170 GHz SiGe HBT Frequency Doubler for Power-Constrained Applications, 2016 IEEE Radio Frequency Integrated Circuits Symposium, RSUIF-6, 2016, pp. 23-26.
Hiroki Asada, et al., A 60 GHz CMOS Power Amplifier Using Capacitive Cross-Coupling Neutralization with 16% PAE, Proceedings of the 6th European Microwave Integrated Circuits Conference, 2011, pp. 554-557.
Mengqi Cui, et al., Design of an Ultra Compact Low Power 60 GHz Frequency Doubler in 22 nm FD-SOI, 2020 IEEE International Symposium on Radio-Frequency Integration Technology (RFIT), 2020, pp. 40-42.
Jixin Chen, et al., A 50-70GHz Frequency Doubler in 90nm CMOS, IEEE, 2012.
Shuai Yuan, et al., Compact V band frequency doubler with true balanced differential output, IEEE BCTM 11.3, 2013, pp. 191-194.
Bo-Yu Chen, et al., A Broadband Doubler with Harmonic Rejection in 90nm CMOS, 2015 IEEE International Symposium on Radio-Frequency Integration Technology, TH1A-3, 2015, pp. 25-27.
Chun-Hsing Li, et al., A Balunless Frequency Multiplier With Differential Output by Current Flow Manipulation, IEEE Transactions on Very Large Scale Integration (VLSI) Systems, 2018, pp. 1391-1402, vol. 26, No. 7.

* cited by examiner

Starting frequency
Offset:100Hz

Ending frequency
Offset:200MHz

PUSH-PUSH FREQUENCY DOUBLING SCHEME AND CIRCUIT BASED ON COMPLEMENTARY TRANSISTORS

CROSS REFERENCE TO THE RELATED APPLICATIONS

This application is a continuation application of International Application No. PCT/CN2021/139748, filed on Dec. 20, 2021 without claiming priority, the entire contents of which are incorporated herein by reference.

TECHNICAL FIELD

The present invention relates to the field of radio frequency technology, specifically to a push-push frequency doubler based on complementary transistors.

BACKGROUND

In radar communications, one of the main challenges of realizing millimeter-wave transceiver systems is how to overcome performance degradation of passive components when operating frequency increases. Among of this, generation of high-quality local oscillators (LO) is particularly important. One solution to generate a high-frequency local oscillator (LO) is to use a frequency doubler so that the output signal generated by the doubler can be the desired local oscillator. However, the conversion gain of conventional structure of the frequency doubler is low, and the single-ended output is difficult to drive high-performance mixers.

In summary, a frequency doubler featuring high conversion and differential output is required.

SUMMARY

Disclosed is a kind of push-push frequency doubler based on complementary transistors featuring a higher conversion gain and differential output.

One example provides a push-push doubler based on a complementary transistor, including a first differential amplifier circuit, a second differential amplifier circuit and an output load circuit;

The first differential amplifier circuit is for receiving a differential input signal with an initial frequency, and amplifies the amplitude of the second harmonic of the differential input signal with an initial frequency to obtain a first signal;

The second differential amplifier circuit is for receiving the differential input signal with an initial frequency, and amplifies the amplitude of the second harmonic of the differential input signal with an initial frequency to obtain a second signal; Where, the first signal and the second signal are differential signals with the same amplitude and a phase difference of 180°;

The output load circuit is used to extract the second harmonics from the first signal and the second signal respectively so as to obtain a differential output signal having a first output frequency, and output the differential output signal with the first output frequency; Where, the first output frequency is twice of the initial frequency.

In one example, a voltage provider terminal VDD is included. Both the first and second differential amplifier circuit consist of multiple transistors;

The voltage provider terminal VDD is used to provide driving current to theses multiple transistors in the first and second differential amplifier circuit;

In one example, a plurality of transistors of have the same type in the first differential amplifier circuit; A plurality of transistors of also have the same type in the second differential amplifier circuit; The type of transistors in the first differential amplifier circuit is different from the that in the second differential amplifier circuit.

In one example, the first differential amplifier circuit consists of transistor MN1, transistor MN2, capacitor CN1, capacitor CN2, resistor RN1 and resistor RN2;

The control pole of the transistor MN1 receives the signal VBN by resistor RN1. The second pole of the transistor MN1 is grounded. The first pole of the transistor MN1 is connected to the first pole of the transistor MN2. The control pole of the transistor MN1 is also connected to one end of the capacitor CN1. The other end of the capacitor CN1 is used to receive one path signal in the differential input signal with an initial frequency. The control pole of the transistor MN2 receives the signal VBN by resistance RN2. The second pole of the transistor MN2 is grounded. The control pole of the transistor MN2 is also connected to one end of the capacitor CN2. The other end of the capacitor CN2 is used to receive another path signal in the differential input signal having an initial frequency. The first pole of the transistor MN1 is also connected to the output load circuit, which is used to output the first signal.

In one example, transistor MN1 and transistor MN2 are both NMOS transistors.

In one example, the second differential amplifier circuit consists of transistor MP1, transistor MP2, capacitor CP1, capacitor CP2, resistor RP1 and resistor RP2;

The control pole of the transistor MP1 receives the signal VBP by resistor RP1. The first pole of the transistor MP1 is connected to VDD. The second pole of the transistor MP1 is connected to the second pole of the transistor MP2. The control pole of the transistor MN1 is also connected to one end of the capacitor CP1. The other end of the capacitor CP1 is used to receive one path signal in the differential input signal with an initial frequency. The control pole of the transistor MP2 receives the signal VBP by resistance RP2. The first pole of the transistor MP2 is connected to the first pole of the transistor MP1. The second pole of the transistor MP2 is connected to output load circuit, which is used to output the second signal. The control pole of the transistor MP2 is connected to one end of the capacitor CP2. The other end of the capacitor CP2 is used to receive another path signal in the differential input signal with an initial frequency.

In one example, transistor MP1 and transistor MP2 are both PMOS transistors.

In one example, the first output frequency is 58-66.5 GHz.

In one example, the transistor MN1 and transistor MN2 have a width of 16 µm and a length of 60 nm. The transistor MP1 and transistor MP2 have a width of 48 µm and a length of 60 nm.

In one example, the output load circuit consists of an inductor L4. One end of the inductor L4 is for receiving the first signal and the other end of the inductor L4 is for receiving the second signal.

In one example, the output load circuit consists of a transformer T2 and a common source amplifier CS.

The transformer T2 is used to balance the first signal output from the first differential amplifier circuit and the second signal output from the second differential amplifier circuit, and output to the common source amplifier CS respectively.

The common source amplifier CS is used to amplify the first signal and the second signal after the phase balance of the transformer T2 and outputs them.

In one example, the common source amplifier CS consists of transistor MN3 and transistor MN4. The control pole of the transistor MN3 is for receiving one path signal output from transformer T2. The control pole of the transistor MN3 is also connected via capacitor CN3 to the first pole of the transistor MN4. The second pole of the transistor MN3 is grounded; The control pole of transistor MN4 is used to receive another path signal output from transformer T2. The control pole of transistor MN4 is also connected to the first pole of transistor MN3 through capacitor CN4. The first pole of transistor MN3 and the first pole of transistor MN4 are connected to the two ends of inductor L7, respectively. The two ends of inductor L7 are used to output the differential output signal.

In one example, it further has an input balun circuit and an output balun circuit;

The input balun circuit is for converting the received single-ended input signal into the differential input signal;

The output balun circuit is for converting the differential output signal from the output load circuit into a single-ended output signal, and output the single-ended output signal.

In one example, the input balun circuit consists of a transformer T1. The primary coil of the transformer T1 is inductor L1 while the secondary coil is inductor L2. Inductor L1 and inductor L2 are coupled with each other. One end of the inductor L1 is for receiving a single-ended input signal, and the other end of the inductor L1 is grounded. Both ends of the inductor L2 are used to output two differential input signals.

In one example, the output balun circuit consists of a transformer T3. The primary coil of the transformer T3 is inductor L5 while the secondary coil is inductor L6. Inductor L5 and inductor L6 are coupled with each other. Both ends of the inductor L5 are connected to the output load circuit 30 to receive differential output signals. One end of the inductor L6 is used to output a single-ended output signal, and the other end of the inductor L6 is grounded.

According to the above example of a push-push frequency doubler based on complementary transistors, the first differential amplifier circuit receives a differential input signal having an initial frequency, and amplifies the amplitude of the second harmonic of the differential input signal to obtain a first signal. The second differential amplifier circuit receives the differential input signal with the initial frequency and amplifies the amplitude of the second harmonic of the differential input signal to obtain the second signal. Where, the first signal and the second signal are a set of differential signals with the same amplitude and a phase difference of 180°. The output load circuit extracts the second harmonic signal in the first and second signal respectively to obtain and output a pair of differential output signal with first output frequency whose value is twice of the initial frequency. As a result, the frequency doubler with differential output signal is realized. These two signals in the output differential signal have the same amplitude, and the conversion gain of the doubler can be greatly improved after the amplitudes of the two signals are superimposed.

DETAILED DESCRIPTION OF THE EMBODIMENTS

Figure 1:
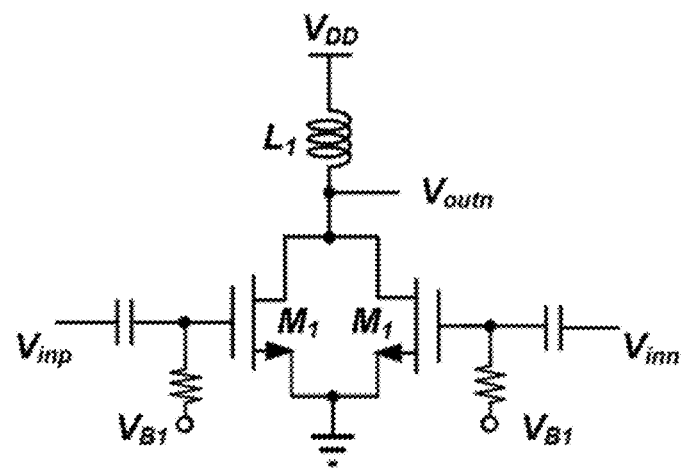
FIG. 1 shows the circuit schematic of the existing NMOS Push-Push doubler.

The present invention is further described in detail below according to a specific implementation with figures. Where different implementations with similar elements are associated with similar components. In the following implementations, many details are described in order to make the application can be better understood. However, technical persons in this area can effortlessly recognize that some of the features may be omitted in different cases, or may be replaced by other elements, materials, methods. In some cases, some of the operations related to the application are not displayed or described in detail, which avoids the core portion of the application being overwhelmed by too much description. For those technical persons in this area, a detailed description of these related operations is not necessary. they can fully understand the relevant operations according to the description in specifications and their general technical knowledge in the area.

Further, the features, operations, or features described in the specification can be arbitrarily combined to form various examples. At the same time, the steps or actions in the methods description can also be adjusted or changed in order apparently by technical persons in this area. Thus, the various orders in the specification and figures are only for a clear description of a particular example, which does not mean that this order is necessary unless a certain order which must be followed is illustrated.

The order numbers themselves in this article such as "first", "second", etc., are used only to distinguish the objects described and do not have any sequential or technical meaning. The "connection" referred to in this application, unless otherwise specified, includes direct and indirect connection.

The transistors involved in the example of the present invention, unless otherwise specified, can be any structures, such as bipolar transistors (BJTs) or field-effect transistors (FETs). When the transistor is a bipolar transistor, its control pole refers to the gate of the bipolar transistor. The first pole can be the collector or emitter of the bipolar transistor, and the corresponding second pole can be the emitter or collector of the bipolar transistor. In actual application process, the "emitter" and "collector" can be interchanged according to the signal flow direction. When the transistor is a field effect transistor, its control pole refers to the gate of the field effect transistor. The first pole can be the drain or source of the field effect transistor, and the corresponding second pole can be the source or drain of the field effect transistor. In actual application process, the "source" and "drain" can be interchanged according to the signal flow direction.

The following are the references involved in the example of the present invention:

Reference 1: B. Razavi, "A 60-GHz CMOS receiver front-end," *IEEE J. Solid-State Circuits*, vol. 41, no. 1, pp. 17-22, January 2006.

Reference 2: B. Floyd et al., "A 60 GHz receiver and transmitter chipset for broadband communications in silicon," in *IEEE Int. Solid-State Circuits Conf. Dig. Tech. Papers*, February 2006, pp. 184-185.

Reference 3: C. Marcu et al., "A 90 nm CMOS low-power 60 GHz transceiver with integrated baseband circuitry," in *IEEE Int. Solid-State Circuits Conf. Dig. Tech. Papers.*, February 2009, pp. 314-315.

Reference 4: D. Lim et al., "Performance variability of a 90 GHz static CIVIL frequency divider in 65 nm SOI CMOS" in *IEEE Int. Solid-State Circuits Conf. Dig. Tech. Papers*, February 2007, pp. 542-543.

Reference 5: J. Chen et al., "Does LO noise floor limit performance in multi-gigabit millimeter-wave communication?" *IEEE Microwave and Wireless Components Letters*, vol. 27, no. 8, pp. 769-771, August 2017.

Reference 6: A. Y.-K. Chen, Y. Baeyens, Y.-K. Chen, and J. Lin, "A 36-80 GHz high gain millimeter-wave double-balanced active frequency doubler in SiGe BiCMOS," *IEEE Microwave and Wireless Components Letters*, vol. 19, no. 9, pp. 572-574, September 2009.

Reference 7: G. Liu, A. C. Ulusoy, A. Trasser, and H. Schumacher, "60-80 GHz frequency doubler operating close to $f_{max}$," in *Proc. of Asia-Pacific Microwave Conference*, December 2010, pp. 770-773.

Reference 8: S. Chakraborty et al., "A K-Band frequency doubler with 35-dB fundamental rejection based on novel transformer balun in 0.13-um SiGe technology," *IEEE Electron Device Letters*, vol. 37, no. 11, pp. 1375-1378, November 2016.

Reference 9: E. Monaco, M. Pozzoni, F. Svelto, and A. Mazzanti, "Injection-locked CMOS frequency doublers for μ-wave and mm-wave applications," *IEEE J. Solid-State Circuits*, vol. 45, no. 8, pp. 1565-1574, August 2010.

Reference 10: F. Ellinger and H. Jackel, "Ultracompact SOI CMOS frequency doubler for low power applications at 26.5-28.5 GHz," *IEEE Microwave and Wireless Components Letters*, vol. 14, no. 2, pp. 53-55, February 2004.

Reference 11: V. Rieβ, P. V. Testa, C. Carta, and F. Ellinger, "Analysis and design of a 60 GHz fully-differential frequency doubler in 130 nm SiGe BiCMOS," in 2018 *IEEE International Symposium on Circuits and Systems (ISCAS)*, May. 2018, pp. 1-5.

Reference 12: M. Moller, "Challenges in the cell-based design of very-high-speed SiGe-bipolar ICs at 100 Gb/s," *IEEE J. Solid-State Circuits*, vol. 43, no. 9, pp. 1877-1888, September 2008.

Reference 13: S. Vehring and G. Boeck, "Truly balanced K-band push-push frequency doubler," 2018 *IEEE Radio Frequency Integrated Circuits Symposium (RFIC)*, 2018, pp. 348-351.

Reference 14: V. Rieβ, C. Carta, and F. Ellinger, "A 60 GHz frequency doubler with differential output in 130 nm SiGe BiCMOS technology," 2018 *Asia-Pacific Microwave Conference (APMC)*, 2018, pp. 279-281.

Reference 15: C. Coen, S. Zeinolabedinzadeh, M. Kaynak, B. Tillack, and J. D. Cressler, "A highly-efficient 138-170 GHz SiGe HBT frequency doubler for power-constrained applications," 2016 *IEEE Radio Frequency Integrated Circuits Symposium (RFIC)*, May. 2016, pp. 23-26.

Reference 16: H. Asada, K. Matsushita, K. Bunsen, K. Okada, and A. Matsuzawa, "A 60 GHz CMOS power amplifier using capacitive cross-coupling neutralization with 16% PAE," 2011 *6th European Microwave Integrated Circuit Conference*, 2011, pp. 554-557.

Reference 17: M. Cui, C. Carta and F. Ellinger, "Design of an ultra compact low power 60 GHz frequency doubler in 22 nm FD-SOI," 2020 *IEEE International Symposium on Radio-Frequency Integration Technology (REIT)*, 2020, pp. 40-42.

Reference 18: J. Chen, P. Yan, and W. Hong, "A 50-70 GHz frequency doubler in 90 nm CMOS", *IEEE MTT-S Int. Microw. Workshop Series on Millim. Wave Wirel. Tech. and Appl. (IMWS)*, 2012, pp 1-3.

Reference 19: S. Yuan and H. Schumacher, "Compact V-band frequency doubler with true balanced differential output," 2013 *IEEE Bipolar/BiCMOS Circuits and Technology Meeting (BCTM)*, 2013, pp. 191-194.

Reference 20: B. Y. Chen, Y. H. Hsiao, and H. Wang, "A broadband doubler with harmonic rejection in 90 nm CMOS," 2015 *IEEE International Symposium on Radio-Frequency Integration Technology (REIT)*, 2015, pp. 25-27.

Reference 21: C. Li and W. Wu, "A balunless frequency multiplier with differential output by current flow manipulation," in *IEEE Transactions on Very Large Scale Integration (VLSI) Systems*, vol. 26, no. 7, pp. 1391-1402, July 2018.

The inventors studied these references. Reference 1-3 provide CMOS transceivers design in 60 GHz millimeter wave band. However, the CMOS transceiver is designed on the premise that a high-frequency local oscillator (LO) needs to be generated for mixing. Reference 4 shows that the use of high frequency synthesizers to generate high frequency local oscillators (LO). However, to generate high frequency local oscillators (LO), voltage-controlled oscillators (VCO) will consume considerable power and exhibit relatively poor spectral purity, phase noise and limited tuning range. The phase-locked loop (PLL) prescaler requires a large input voltage swing, which will eventually make the voltage-controlled oscillator (VCO) itself consume more power. Reference 5-8 show that another solution for generating high-frequency LO is to use frequency multiplication. Although the phase noise of the signal after N multiplication will be $20 \log_{10} N$ dB higher than the input signal, but the VCOs have a higher quality factor at lower frequencies. In addition, the power requirements of the VCO for low-power transceiver designs will be relax. There are still trade-offs between phase noise, tuning range, power consumption, and circuit complexity. This depends on the specific requirements of the system that needs to be designed. Reference 9 shows a review of frequency doubler technology, and the circuit structure of the frequency doubler is divided into four types: single-stage amplifier structure (Reference 10), Gilbert units (Reference 6), push-push (PP) structures (Reference 8 and 11), and injection-locked frequency doubling techniques (Reference 9). Among them, Gilbert unit frequency doubler can achieve high conversion gain and wide frequency band, but its power consumption is usually large and susceptible to DC offset. Injection-locked doubler can increase the output amplitude and achieve lower power consumption, however, on the one hand, the design of high-frequency VCO is more difficult. On the other hand, if tuning technology is not added, injection-locked doubling technology will show a very narrow bandwidth. The push-push doubling structure takes advantage of the nonlinearity of the device, which has good fundamental rejection and is easy to implement. However, conventional push-push structure features a low conversion gain and the single-ended output is difficult to drive the high-performance mixers. Reference 12 shows that it is necessary to achieve differential signals at high frequencies to avoid accurate simulation of the current return path in the design. References 13-15 show some performance improvements to the push-push doubler. Reference 13 shows an inductor-based phase shifter with two push-push doubling cores can achieve a larger balanced differential output. However, this method doubles the power consumption and the phase shifter occupies a very large area, making it difficult to apply to highly integrated systems. Although reference 14 introduces a silicon-based phase shifter to create two differential inputs with opposite phases with two doubling cores to reduce the chip area, the efficiency of this doubler is still low. In addition, the differential input signal suffers from the insertion loss and phase shift error of the phase shifter. Reference 15 shows some power-limited applications. In recent years, high-efficiency frequency doublers with amplifiers using compound semiconductors appear. However, unbalanced output, cost, and system integration are still issues.

Figure 2:
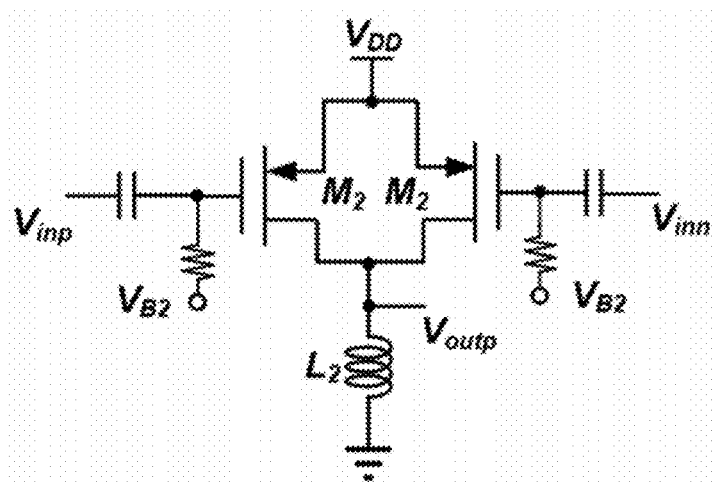
FIG. 2 shows the circuit schematic of the existing PMOS Push-Push doubler.

FIG. 1 and FIG. 2 are structural diagrams of the existing push-push structure doubler (PP doubler). FIG. 1 shows the NMOS PP doubler, which includes two identical NMOS transistors. FIG. 2 shows the PMOS PP doubler, which includes two identical PMOS transistors. PP doubler pushes the generated current into the inductive load. Since the peak impedance of the inductive load is designed at the second harmonic frequency of the input signal, and the fundamental wave is suppressed by the load characteristics of the inductive load, the frequency of the output signal from the PP doubler is therefore twice of that of the input signal. The present example takes the NMOS PP doubler as an example, the input signal $V_{inp}$ is expressed as $V_{inp}=V_p \sin(\omega t)$. The differential signal at the gates of transistor M1 are $V_{inp}=V_p \sin(\omega t)+V_{B1}$ and $V_{inn}=-V_p \sin(\omega t)+V_{B1}$, respectively.

If NMOS PP doublers are considered to be general nonlinear systems, the current at the common-mode node retains only even-order harmonics. For each NMOS transistor in the PP doubler, the output current is $$I_{NMOS} = \begin{cases} 0, & V_{B1} < V_{THN} \\ \frac{K_n}{2}(V_{inp} - V_{THN})^2, & V_{B1} \geq V_{THN} \end{cases}$$

where the $V_{B1}$ is the bias voltage of the transistor, and the $V_{THN}$ is the threshold voltage of the transistor. In order to maximize the second harmonic output current, the bias voltage $V_{B1}$ should be close to the threshold voltage $V_{THN}$. Since the two inputs are converted to current only in half a cycle, the NMOS PP doubler output voltage is $$v_{outn} = V_{DD} - R_{Ln}\frac{K_n}{4}V_p^2[1 - \cos(2\omega t)],$$

where $R_{Ln}$ represents resonating load impedance at inductor L1 in PP NMOS doubler. $K_n$ is transconductance of NMOS transistor. It can be seen that the output of the NMOS PP doubler generates a second harmonic signal.

Similarly, in PMOS PP doubler the output voltage is $$V_{outp} = R_{Lp}\frac{K_p}{4}V_p^2[1 - \cos(2\omega t)],$$

where $R_{Lp}$ is resonating load impedance at inductor L2 in PP PMOS doubler.

Since the output voltage of NMOS and PMOS PP doubler have the same amplitude and a phase difference of 180° under the same input signal. Based on the characteristics of output voltages in NMOS and PMOS PP doubler, the frequency doubler provided in the example of the present invention combines NMOS and PMOS PP doubler together to increase the amplitude of the output signal along with the conversion gain. It can also output a differential signal, which is convenient for driving high performance mixers.

Figure 3:
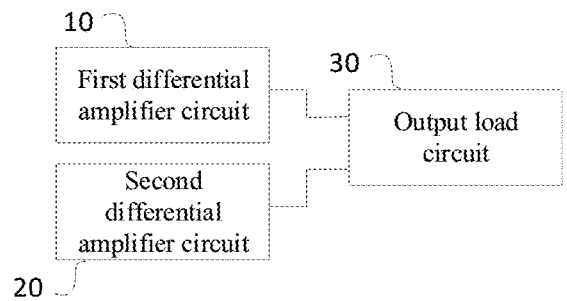
FIG. 3 is a structure diagram of push-push frequency doubler based on complementary transistors in one example.

FIG. 3 is a structural diagram of a PP doubler based on complementary transistor-based of one example of the present invention, hereinafter referred to as a doubler. A doubler can include a first differential amplifier circuit 10, a second differential amplifier circuit 20 and an output load circuit 30, which will be specified below.

The first differential amplifier circuit 10 is for receiving a differential input signal having an initial frequency. It amplifies the amplitude of the second harmonic of the differential input signal with an initial frequency, and to obtain a first signal. The first differential amplifier circuit 10 has two input terminals. The differential input signal consists of two path signals. These two signals are sent into the first differential amplifier circuit 10 through two input terminals. By setting of internal parameters, the first differential amplifier circuit 10 amplifies the amplitude of the second harmonic in differential input signal.

The second differential amplifier circuit 20 is for receiving a differential input signal having an initial frequency. It amplifies the amplitude of the second harmonic of the differential input signal with an initial frequency, and to obtain a second signal. The input terminals of second differential amplifier circuit 20 are connected to those of first differential amplifier circuit 10. That is, the input terminals of second differential amplifier circuit 20 are the same as those of first differential amplifier circuit 10. In addition, from the view of input terminals, the structures of the first and second amplifier circuit are the same, which has two inputs. Two differential input signals are sent into the second differential amplifier circuit 20 through two input terminals. By setting of internal parameters, the second differential amplifier circuit 20 amplifies the amplitude of the second harmonic in differential input signal.

In the present example, the amplitude of first signal from the first differential amplifier circuit 10 and the second signal from the second differential amplifier circuit 20 have the same amplitude. The phase difference between them is 180°. The first signal and the second signal form a pair of differential signals.

Output load circuit 30 is to extract the second harmonics in the first signal and the second signal, and to obtain a differential output signal with a first output frequency. In the present example, the output load circuit 30 is characterized by an inductive load, which can suppress the fundamental signal and extract the second harmonic signal in the first and second signal. The first output signal and the second output signal are differential signals having a first output frequency. The frequency of first output frequency is twice of the initial frequency. That is, the frequency of the differential output signal from the output load circuit 30 is twice of the initial frequency, realizing frequency doubling. Also, due to the fact that the amplitudes of both the first and second output signals are amplified and identical, a higher conversion gain of the frequency doubler is achieved.

In one example, the first differential amplifier circuit 10 and the second differential amplifier circuit 20 are all based on transistor structures, which includes a plurality of transistors. In the present example, the first differential amplifier circuit 10 and the second differential amplifier circuit 20 all transistors are driven by a voltage source. Compared to the existing PP doubler, there is no need to add a new driving voltage source, which also does not occupy much chip area and realizes low power consumption. In the present example, it is possible to amplify the amplitude of the second harmonic signal in the differential input signal by adjusting the value of the bias voltage of the transistor. For example, adjust the bias voltage of the transistor so that it is equal to or infinitely close to the threshold voltage of the transistor. The threshold voltage of the transistor is the open voltage of the transistor, which varies from type to type.

In some examples, the frequency doubler provided in the present invention can be applied to a communication device based on the millimeter wave band. For instance, the signal of transceiver in the millimeter wave band requires a high-frequency local oscillator to be mixed. However, the frequency of the voltage-controlled oscillator output signal cannot reach the millimeter wave band, so the frequency doubler will doubler the frequency of voltage-controlled oscillator output. For example, the frequency doubler provided by the present example based on the complementary transistor can output 58-66.5 GHz differential signals after the frequency doubling to be a local oscillator and can be used for excitation of mixers in transceivers working at the 58-66.5 GHz band.

The following are detailed descriptions of each circuit and module in the frequency doubler.

Figure 4:
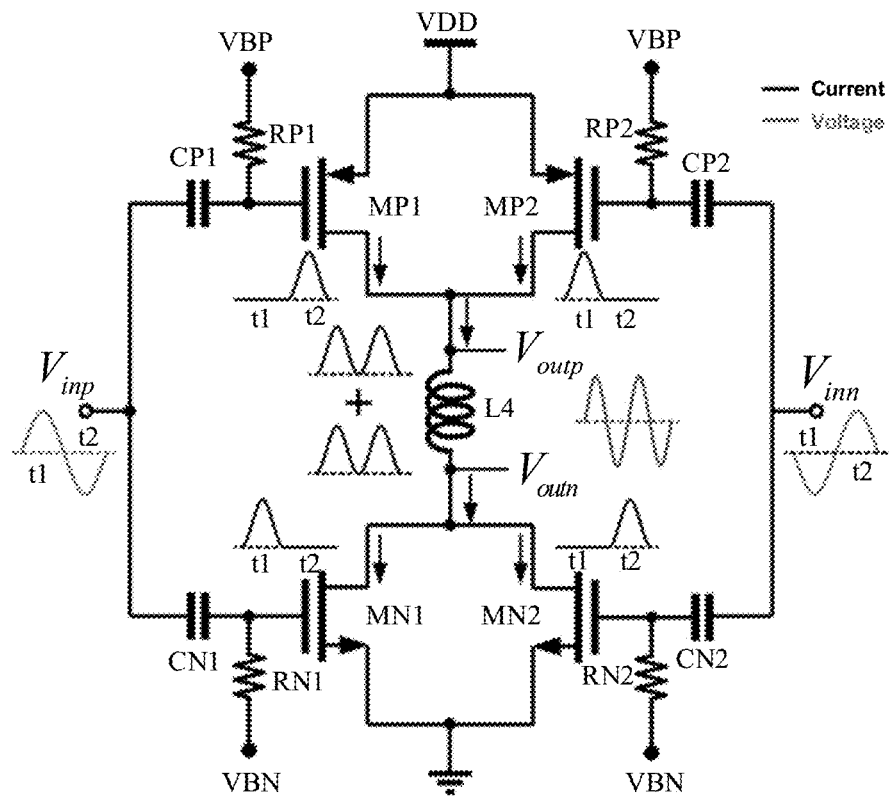
FIG. 4 shows the schematic of the frequency doubler shown in FIG. 3.

Referring to FIG. 4, the first differential amplifier circuit 10 has two input terminals, which are used to receive two differential input signal $V_{inn}$ and $V_{inp}$. By adjusting the bias voltage of internal transistors, the transistors are biased at its threshold voltage to maximize the output second harmonic amplitude.

In some examples, the first differential amplifier circuit 10 includes transistor MN1, transistor MN2, capacitor CN1, capacitor CN2, resistor RN1 and resistor RN2.

The control pole of transistor MN1 receives the signal VBN through resistor RN1. The second pole of transistor MN1 is grounded. The first pole of transistor MN1 and MN2 are connected. The control pole of transistor MN1 is also connected to one end of capacitor CN1, and the other end of capacitor CN1 is used to receive one path of signal from the differential input signal with an initial frequency. The control pole of transistor MN2 receives the signal VBN through resistor RN1. The second pole of transistor MN2 is grounded. The control pole of transistor MN2 is also connected to one end of capacitor CN2, and the other end of capacitor CN2 is used to receive the other path of signal from the differential input signal with an initial frequency. The first pole of the transistor MN1 is also connected to the output load circuit 30, which is used to output the first signal to the output load circuit 30.

Where, the transistor MN1 and transistor MN2 are the same two NMOS transistors. The capacitor CN1 and capacitor CN2 have the same parameters, and the resistance RN1 and the resistance RN2 have the same parameters.

In the present example, the bias voltage of transistor MN1 and transistor MN2 is provided by the voltage signal VBN. Therefore, the bias voltage of transistor MN1 and transistor MN2 can be adjusted by tuning VBN so that the bias voltage is the same as the threshold voltage of the transistor.

The second differential amplifier circuit 20 is the same as the first differential amplifier circuit 10, which has two inputs receiving differential input signal $V_{inn}$ and $V_{inp}$. By adjusting the bias voltage of its internal transistor, the second differential amplifier circuit 20 transistors are biased at its threshold voltage to maximize the output amplitude of the second harmonic.

In some examples, the second differential amplifier circuit consists of transistor MP1, transistor MP2, capacitor CP1, capacitor CP2, resistor RP1 and resistor RP2.

The control pole of transistor MP1 receives the VBP through resistor RP1. The first pole of transistor MP1 is connected to a voltage terminal VDD. The second pole of transistor MP1 and MP2 are connected. The control pole of transistor MP1 is also connected to one end of capacitor CP1. The other end of capacitor CP1 is used to receive one path of differential input signal with an initial frequency. The control pole of the transistor MP2 is connected to the VBP through resistor RP2. The first pole of the transistor MP2 is connected to the first pole of the transistor MP1. The second pole of the transistor MP2 is connected to the output load circuit 30, which is used to output second signal to the output load circuit 30. The control pole of the transistor MP2 is also connected to one end of the capacitor CP2. The other end of the capacitor CP2 is used to receive another path of differential input signal with an initial frequency.

The transistor MP1 and transistor MP2 are the same two PMOS transistors. The capacitor CP1 and capacitor CP2 have the same parameters. The resistance RP1 and the resistance RP2 have the same parameters.

In the present example, the bias voltage of transistor MP1 and transistor MP2 is provided by the voltage signal VBP. Therefore, the bias voltage of transistor MP1 and transistor MP2 can be adjusted by tuning VBP so that the bias voltage is the same as the threshold voltage of the transistor.

The first differential amplifier circuit 10 and the second differential amplifier circuit 20 constitute the core module of the doubler. From the description of the first differential amplifier circuit 10 and the second differential amplifier circuit 20 above, it can be seen that the driving current is provided by the same voltage provider terminal VDD. Therefore, compared with the existing PP doublers, the core module of the frequency doubler provided in the example of the present invention does not have additional driving voltage source. The core chip area of the core module does not increase much compared with that of the existing PP doublers. It maintains a small chip area while achieving differential output.

Output load circuit 30 is to extract the second harmonic signals in the first and second signal outputted from the first and second differential amplifier circuit 10 and 20. The output load circuit 30 is inductive, which can help suppress the fundamental signal and obtain a second harmonic signal.

In some examples, the output load circuit 30 includes inductor L4. Inductor L4 is connected between the first differential amplifier circuit 10 and the second differential amplifier circuit 20. That is, the two ends of the inductor L4 are the output terminals of the first differential amplifier circuit 10 and the second differential amplifier circuit 20.

The present example can set an appropriate value of the inductor L4 so that the inductor L4 and the parasitic capacitance in the transistor can resonate at the frequency of the second harmonic. Then the inductor L4 can extract the second harmonic signal so that the frequency doubler can output a differential output signal whose frequency is doubled.

The input and output signals of the frequency doubler shown in FIG. 4 are analyzed below.

Take one signal cycle as an example, which includes two time slots t1 and t2. Assuming that transistor MN1, transistor MN2, transistor MP1, and transistor MP2 are all biased at their threshold voltages at first to maximize the output amplitude of the second harmonic. The differential input signals are $V_{inp}$ and $V_{inn}$. Taking the first amplifier circuit 10 as an example, in time slot t1, $V_{inp}$ is higher than the threshold voltage of transistor MN1 and transistor MN2 $V_{THN}$, and the $V_{inn}$ is lower than $V_{THN}$. In time slot t2, $V_{inn}$ is higher than the threshold voltage of transistor MN1 and transistor MN2 $V_{THN}$, and the $V_{inp}$ is lower than $V_{THN}$. Under the above bias strategy, the $V_{inp}$ will be amplified in time slot t1 and $V_{inn}$ will be amplified in time slot t2. Thus, the output signal phase at node B is opposite to $V_{inp}$ in time slot t1, and in time slot t2 it is opposite to $V_{inn}$. The voltage at node A is similar to the principle of node B, which eventually makes the doubler form a differential output signal $V_{outp}$ and $V_{outn}$. The present example of the invention finally extracts the second harmonic signal by letting inductor L4 and parasitic capacitance resonate in the corresponding frequency range. Compared with the existing PP doublers, this structure makes full use of the input signal for frequency conversion. When the DC current and supply voltage remain unchanged, the doubler will not increase the core chip area and power consumption. In addition, the differential output helps drive high performance mixers.

The following is a load model of a frequency doubler. The analysis of the amplitude of the differential output signal is carried out.

Figure 5:
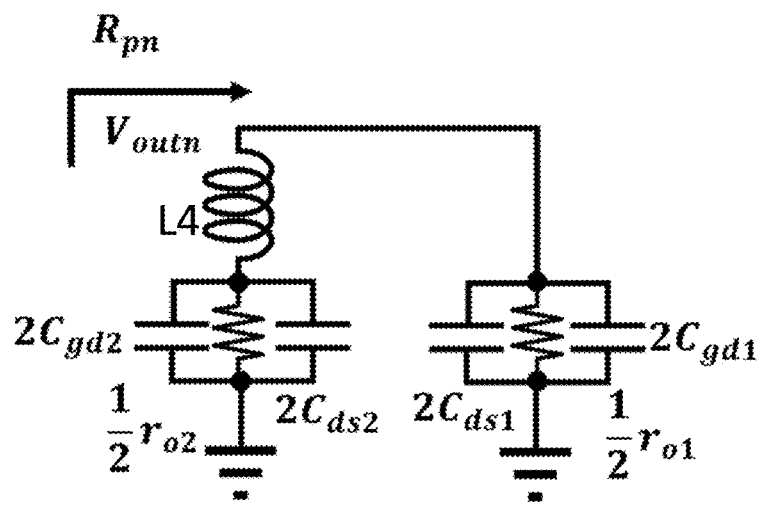
FIG. 5 is a diagram of an output load model of an example.

The present example takes the output terminal of the first differential amplifier circuit 10 as an example to analyze the output load model of the entire frequency doubler. FIG. 5 is a diagram of an output load model in an example. Taking the small signal input as an example, the output impedance $R_{pn}$ of the output load model seen from the output terminal of the first differential amplifier circuit 10 can be expressed as:

$$R_{pn} = \left(sL_3 - \frac{r_{o2}}{2s(C_{gd2}+c_{ds2})r_{o2}+2}\right) / \left(\frac{r_{o1}}{2s(C_{gd1}+c_{ds1})r_{o1}+2}\right)$$

Similarly, the output impedance $R_{pp}$ of the output load model seen from the output terminal of the second differential amplifier circuit 20 can be expressed as:

$$R_{pp} = \left(sL_3 - \frac{r_{o1}}{2s(C_{gd1}+c_{ds1})r_{o1}+2}\right) / \left(\frac{r_{o2}}{2s(C_{gd2}+c_{ds2})r_{o2}+2}\right)$$

where s=jω, $r_{o1}$ is the output resistance of transistor MN1 (MN2). $r_{o2}$ is the output resistance of transistor MP1 (MP2). $C_{gd1}$ is the gate-drain parasitic capacitance of transistor MN1 (MN2). $C_{gd2}$ is the gate-drain parasitic capacitance of transistor MP1 (MP2). $L_4$ is inductance of inductor L4.

From the output impedance $R_{pn}$ and $R_{pp}$, it can be seen that the resonant frequency of the doubler is mainly affected by the parasitic capacitance of transistors and L4. Therefore, based on the size of the parasitic capacitance of the transistor, the inductance L4 can be set properly so that L4 and the parasitic capacitance resonate at the second harmonic frequency to amplify the amplitude of the second harmonic signal.

According to the output impedance $R_{pn}$ and $R_{pp}$, the amplitude of the differential output signal of the frequency doubler $V_{pd}$ shown in FIG. 4 can be expressed as:

$$V_{pd} = (1+\lambda_p v_{dsp})R_{pp}\frac{K_p}{4}V_p^2[1-\cos(2\omega t)] - \left\{V_{DD}-(1+\lambda_n V_{dsn})R_{pn}\frac{K_n}{4}V_p^2[1-\cos(2\omega t)]\right\},$$

where $\lambda_p$ is the channel length modulation coefficient of the PMOS transistor. $\lambda_n$ is the channel length modulation coefficient of the NMOS transistor. the $K_p$ is the transconductance of the PMOS transistor. $K_n$ is the transconductance of the NMOS transistor. $V_{dsp}$ is the drain voltage of the PMOS transistor. $V_{dsn}$ is the drain voltage of the NMOS transistor. $V_{DD}$ is the driving voltage. $V_p$ is the amplitude of the differential input signal.

In other examples, the output load circuit 30 includes a transformer T2 and a common source amplifier CS.

The transformer T2 is used to balance the first signal output from the first differential amplifier circuit 10 and the second signal output from the second differential amplifier circuit 20, and output to the common source amplifier CS respectively. The common source amplifier CS is used to amplify the first signal and the second signal after the phase balance of the transformer T2 and outputs them.

The primary coil of transformer T2 is inductor L4 while the secondary coil is inductance L3. Inductor L4 and inductor L3 are coupled with a coupling coefficient k2. Inductor L4 is connected between the first differential amplifier circuit 10 and the second differential amplification circuit 20. One end of inductor L3 is connected to the positive input pin of the common source amplifier CS, and the other end is connected to the negative input pin of the common source amplifier CS. In addition, inductor L3 has another bias terminal, which is used to connect the operating voltage.

The primary coil of transformer T2 is inductive. Under the coupling, it can balance the unbalanced first signal and the second signal, and then amplified by the common source amplifier CS so that the output of the first output signal and the second output signal have a large amplitude, improving the overall conversion gain of the frequency doubler.

In some application environments, the input and output of the frequency doubler requires a single-ended signal. For example, in simulation, in order to facilitate the input signal and the acquisition of output signals, a single-pin interface is used for single-ended signal input and output. In some examples, referring to FIG. 6, the present example of complementary transistor-based push-push doubler (doubler) further consists of input balun circuit 40 and output balun circuit 50.

Input balun circuit 40 is for converting the single-ended input signal into differential input signals. The input balun circuit 40 includes a three-port device. The input balun circuit 40 includes a width RF transmission line transformer, the transformer can convert a single-ended input signal into a differential input signal to achieve a connection between the balanced transmission line circuit and an unbalanced transmission line circuit.

The output balun circuit 50 is for converting the differential output signal from the output load circuit into a single-ended output signal, and outputting the single-ended output signal. The output balun circuit 50 is similar in principle to the input balun circuit 40, which has a width RF transmission line transformer capable of converting the differential output signal into a single-ended output signal.

Figure 7:
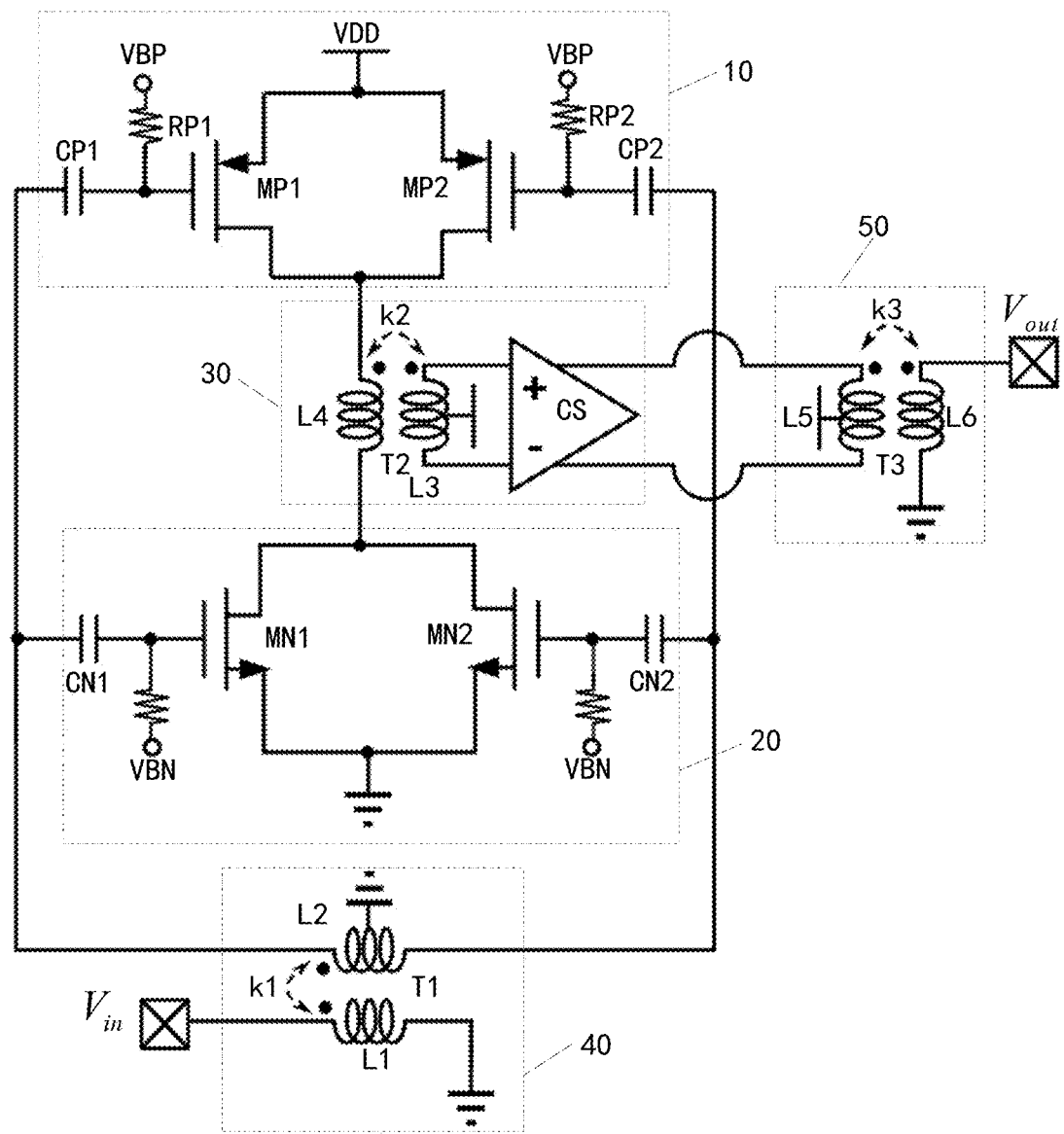
FIG. 7 shows the schematic of the frequency doubler shown in FIG. 6.

Referring to FIG. 7, in one example, the input balun circuit 40 includes a transformer T1 whose primary coil is inductor L1 and secondary coil is inductor L2. The inductor L1 and inductor L2 are coupled with a coupling coefficient k1. One end of inductance L1 is used to receive a single-ended input signal while the other end of inductor L1 grounded. Both ends of inductance L2 are used to output two differential input signal. Inductor L2 also has an terminal for grounding.

Output balun circuit 50 includes transformer T3 whose primary coil is inductor L5 and secondary coil is inductor L6. Inductor L5 and inductor L6 are coupled with a coupling coefficient k3. Both ends of inductor L5 are connected to the output load circuit 30 to receive differential output signals. One end of inductor L6 is used to output a single-ended output signal, and the other end of inductor L6 is grounded. The inductor L5 has a bias terminal to connect the operating voltage.

Figure 8:
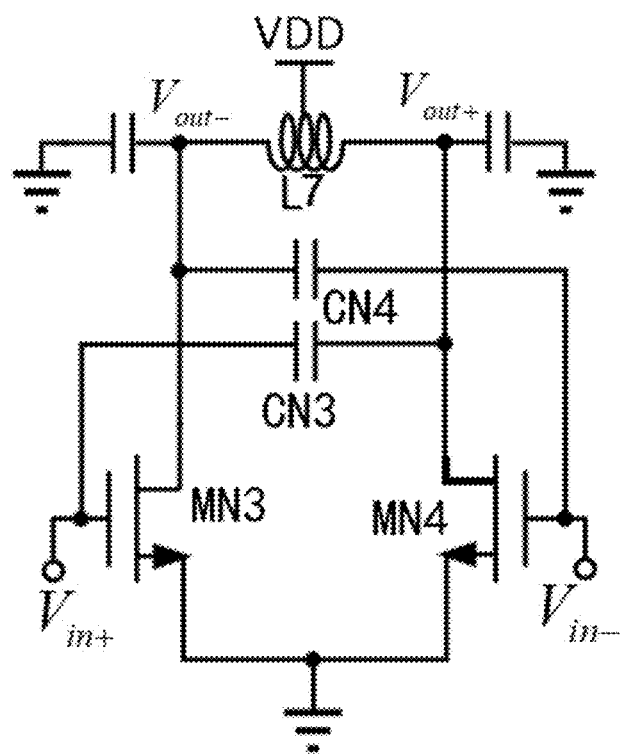
FIG. 8 is a circuit schematic of a common source amplifier in an example.

Referring to FIG. 8, it shows a schematic of a common source amplifier CS which has a transistor MN3 and a transistor MN4. The control pole of the transistor MN3 is used to receive a positive input signal $V_{in+}$. The control pole of the transistor MN3 is connected to the first pole of the transistor MN4 via the capacitor CN3. The second pole of the transistor MN3 is grounded. The control pole of the transistor MN4 is used to receive a negative input signal $V_{in-}$. The control pole of the transistor MN4 is also connected to the first pole of the transistor MN3 via the capacitor CN4. The first pole of transistor MN3 and the first pole of transistor MN4 are connected to the two ends of inductance L7 which are used to output $V_{out-}$ and $V_{out+}$, respectively. $V_{in+}$ is the signal received at the positive input of the common source amplifier CS. $V_{in-}$ is the signal received at the negative input of the common source amplifier CS. $V_{out-}$ and $V_{out+}$ are output signals of the common source amplifier CS.

The following simulation experiment verifies the effect of the frequency doubler shown in FIG. 7.

Simulations were performed at 30 GHz using HFSS software, where inductor L1 and L2 in transformer T1 were 104 pH and 297 pH with a coupling coefficient $k_1$ equal to 0.8. 7.9 kΩ resistor RN1, RN2, RP1, and RP2 were designed to prevent signal leakage to the bias supply. MoM capacitors CN1, CN2, CP1 and CP2 are 617 fF. Under a single-ended input signal of 0-dBm, the gate voltage amplitude of transistor MP1 (MP2) and transistor MN1 (MN2) obtained by simulation is 310 mV. In order to convert the unbalanced differential output signal at inductor L4 into a balanced differential output signal, the transformer is used at the load. The balanced differential output signal output of the transformer T2 is finally amplified by the common source amplifier CS and converted to a single-ended output signal by transformer T3.

Figure 9:
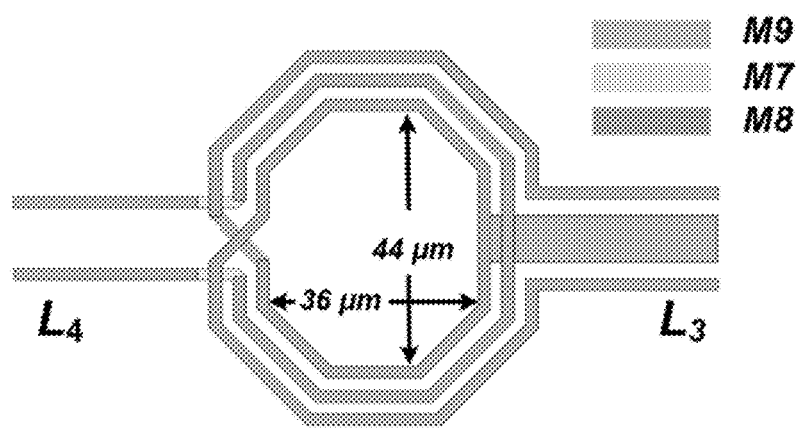
FIG. 9 shows the layout of the transformer T3.

Under the comprehensive consideration of circuit power dissipation, parasitic effects and current amplification capability in present frequency doubler example, the width of the transistor MN1 (MN2) is selected to be 16 μm, and the length is 60 nm. FIG. 9 is a layout diagram of the transformer T2. A two-turn inductor L3 and one-turn inductor L4 are 360 pH and 110 pH at 60 GHz. The line width is designed to be 2.05 μm to reduce the skin effect. The line spacing is designed to be 2 μm to achieve tight coupling. The simulated coupling coefficient k2 of inductor L3 and L4 is 0.85. The operating voltage selection is 1 V, where M7, M8, M9 represent the layer of the metal wire such as the seventh, eighth and ninth layer, respectively.

Figure 6:
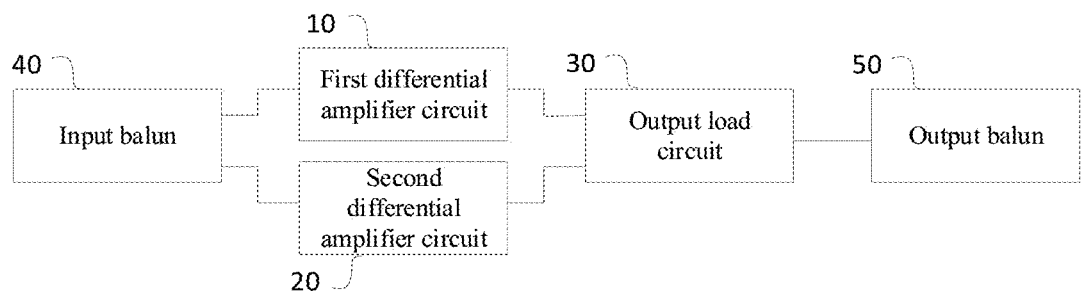
FIG. 6 is another structure diagram of push-push frequency doubler based on complementary transistors in one example.
Figure 10A:
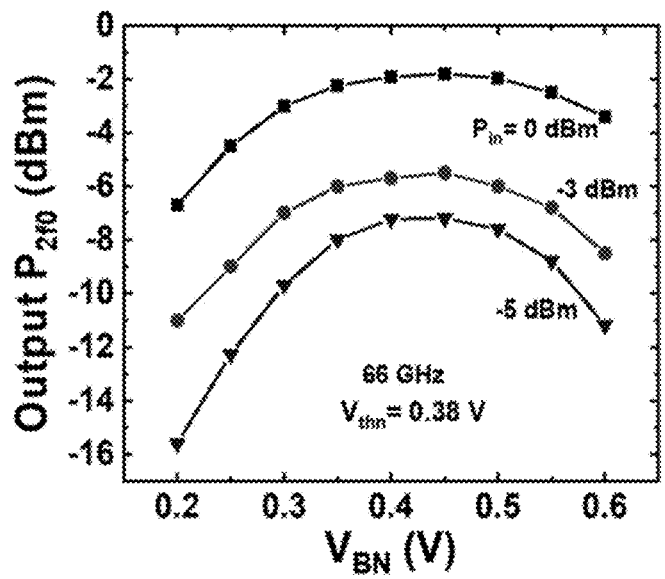
FIGS. 10A-10B show a simulated relationship between the bias voltage of the doubler and the output power.
Figure 10B:
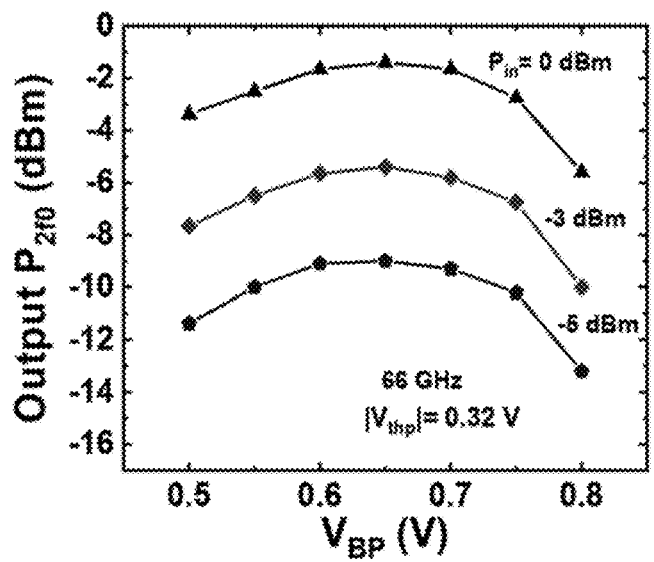

In order to verify that the bias strategy of adjusting the gate bias voltage of the transistor to the threshold voltage produces the maximum double frequency output power of the doubler, and thus finds the optimal gate bias voltage for transistor MP1 (MP2) and transistor MN1 (MN2), the optimization process can first fix the signal VBP to find the optimal signal VBN. After finding the optimal signal VBN, it is recorded as $V_{BNOP}$, and then the signal VBP is optimized by setting VBN=$V_{BNOP}$. In FIG. 6, supposing the width of transistor MN1 (MN2) $W_1$=16 μm and the width of transistor MP1 (MP2) $W_2$=48 μm, whose length are 60 nm, FIG. 10A shows the simulated output power of the doubler at 66 GHz output frequency where VBP=0.7 V. FIG. 10B shows the simulated output power of the doubler at 66 GHz output frequency VBN=0.4 V. The threshold voltage of transistor MN1 (MN2) and transistor MP1 (MP2) at room temperature are 0.38 V and 0.32 V, respectively. It can be observed that under different input levels, the maximum output power is achieved around VBN=0.42 V and VBP=0.65 V when the output power optimization is performed separately, which verifies the correctness of the bias strategy of adjusting the gate bias voltage of the transistor to the threshold voltage.

Based on the above bias conditions, the following conditions are known. (1) The transistor MN1 (MN2) and transistor MP1 (MP2) are in the saturated region, ensuring good current amplification capability; (2) Transistor MN1 (MN2) and transistor MP1 (MP2) are both in the bias strategy status where the bias voltage is equal to the threshold voltage and they share the same bias current ID. If the channel length modulation effect (coefficients $\lambda_n$ and $\lambda_p$, respectively), then we have the following equations:

$$I_D = \frac{1}{2}K'_n \frac{W_1}{L}(V_{BN} - V_{thn})^2 (1 + \lambda_n V_{dsn}) =$$
$$\frac{1}{2}K'_p \frac{W_2}{L}(V_{DD} - V_{BP} - |V_{thp}|)^2 (1 + \lambda_p V_{dsp})$$

If the bias current is relatively small and the voltage drop of inductor L is negligible, there is an approximate relationship that $V_{dsp}+V_{dsn}=V_{DD}$. In the above bias strategy, the square terms in the upper equation are approximately equal, so the upper equation can be rewritten as:

$(1+\lambda_p V_{dsp})K'_p W_2 = [1+\lambda_n(V_{DD}-V_{dsp})]K'_n W_1$

Since $K_p'$, $K_n'$, $\lambda_n$, $\lambda_p$ are constants, if we specify $W_1$ and $V_{DD}$, then the $V_{dsp}$ and $V_{dsn}$ are determined by the $W_2$. The value of the $W_2$ is also related to the optimal conversion gain of the doubler. When the $W_2$ is sufficient small, the bias current and $V_{dsn}$ become smaller together. Assuming that the amplitude of the differential output voltage at L4 is $V_{pd}$ is $A_{pd}$, and the transistor MN1 (MN2) is still operating in the saturation region ($V_{dsn}$ is slightly greater than $V_{dsatn}$) at the large signal input, the amplitude of the differential output signal $A_{pd}$ is limited, so that:

$$A_{pd} \leq V_{dsn} - V_{dsatn}.$$

When the $W_2$ is too large, $V_{dsn}$ increases and $V_{dsp}$ decreases, the upper limit of the $A_{pd}$ is also limited:

$$A_{pd} \leq V_{DD} - V_{dsatp} - V_{dsn}.$$

Figure 11:
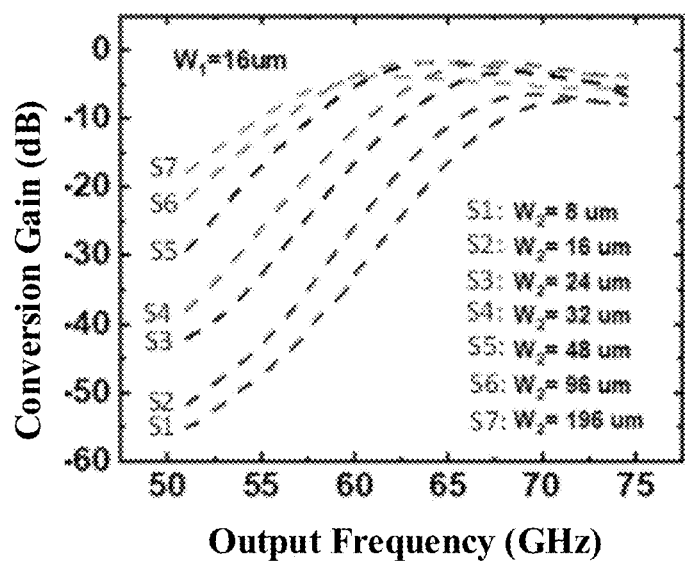
FIG. 11 shows a simulated conversion gain versus transistor widths of the frequency doubler.

FIG. 11 shows the simulated effect of the $W_2$ on conversion gain at an output frequency of 66 GHz (simulation condition: 0 dBm input, $W_1$=16 µm). As the $W_2$ increases from 8 µm to 32 µm, the conversion gain increases while the gain peak frequency decreases. When $W_2$=128 µm, the simulated output signal amplitude of the first differential amplifier circuit $V_{outn}$ and the output signal of the second differential amplifier circuit $V_{outp}$ are 300 mV and 40 mV, respectively. The reason for the small amplitude of the $V_{outp}$ is mainly due to that the output resistance $R_{pp}$ of the transistor MP1 (MP2) is smaller than the output resistance of the NMOS transistor $R_{pn}$, resulting in a small parallel resistance. On the other hand, from the perspective of $R_{pn}$, the equivalent quality factor of inductor L4 (including the output resistance of MP1 (MP2)) gradually increases. As a result, the total resonant shunt output resistance $R_{pn}$ and $V_{outn}$ increase. When $W_2$ is further increasing, such as to be 196 µm, the amplitude of the differential output signal $A_{pd}$ will begin to be limited and duce large parasitic parameters will be introduced. In addition, for fixed $W_1$ and supply voltage, larger $W_2$ results in more power dissipation. Therefore, in the simulation design, in order to leave enough parasitic margin for the doubler, the width $W_2$ of the transistor MP1 (MP2) is designed to be 32 µm, and the simulated $V_{dsn}$ is 0.48 V.

The above is a description of the frequency doubler in some examples of the present invention.

Figure 12:
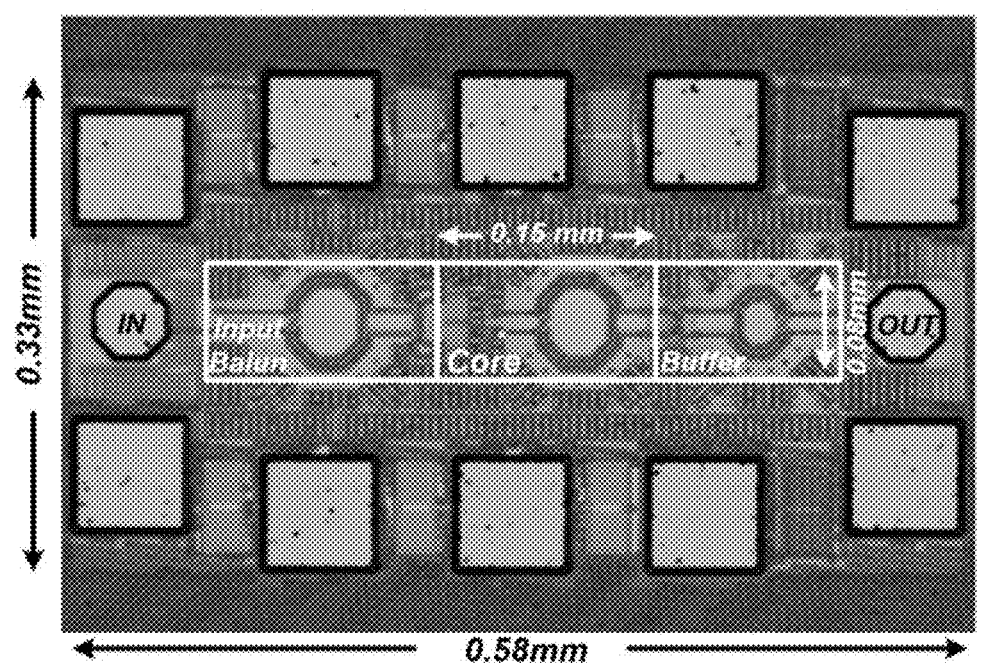
FIG. 12 shows a chip photo of frequency doubler for testing.
Figure 13A:
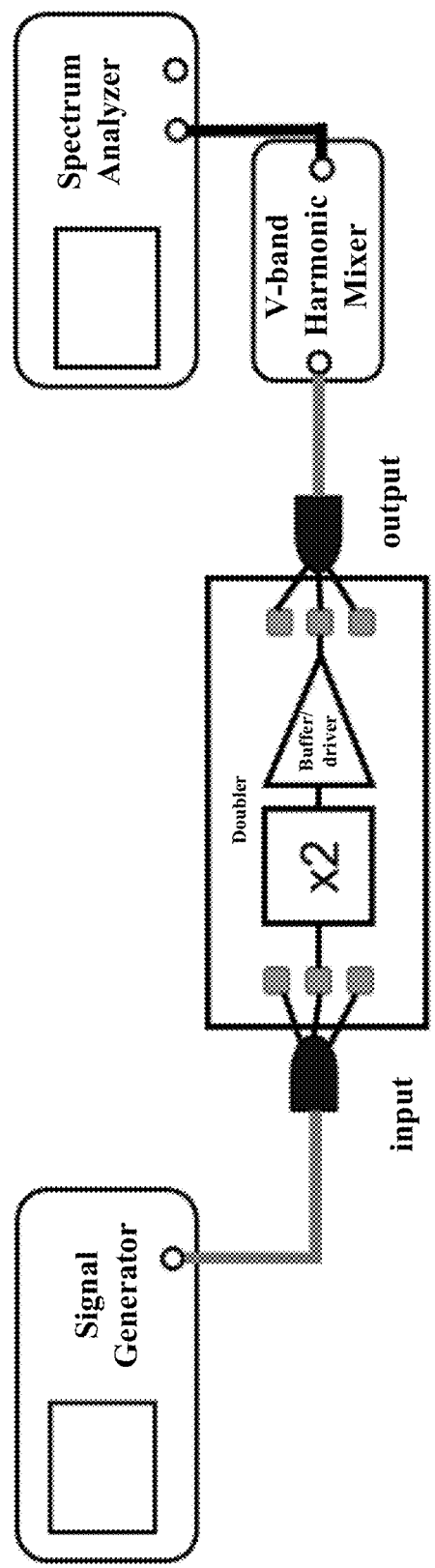
FIGS. 13A-13B show the structural diagram of the testbench.
Figure 13B:
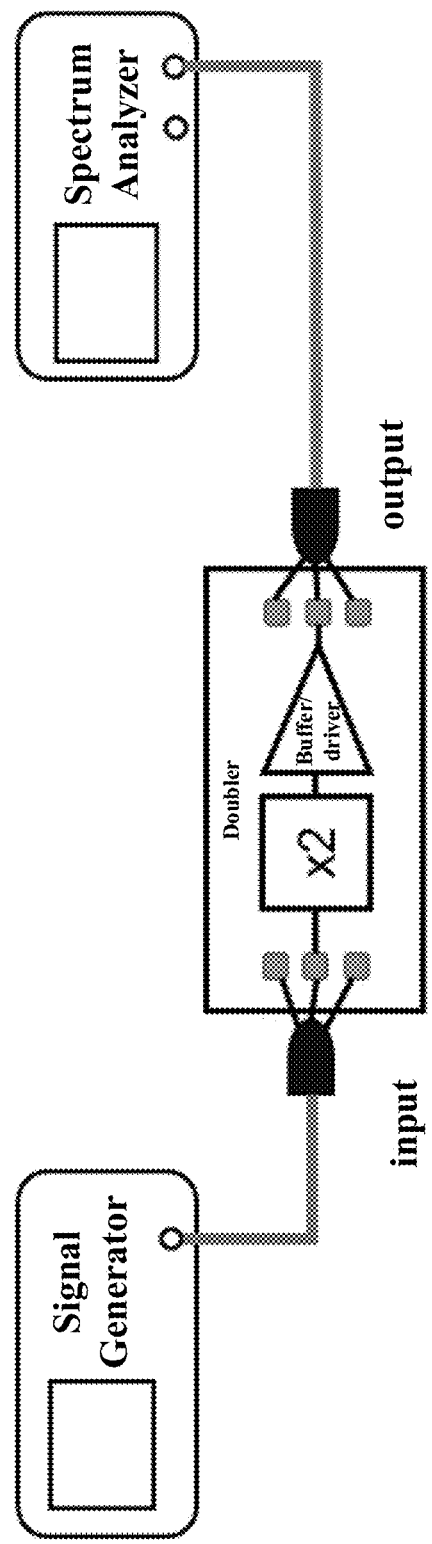
Figure 14:
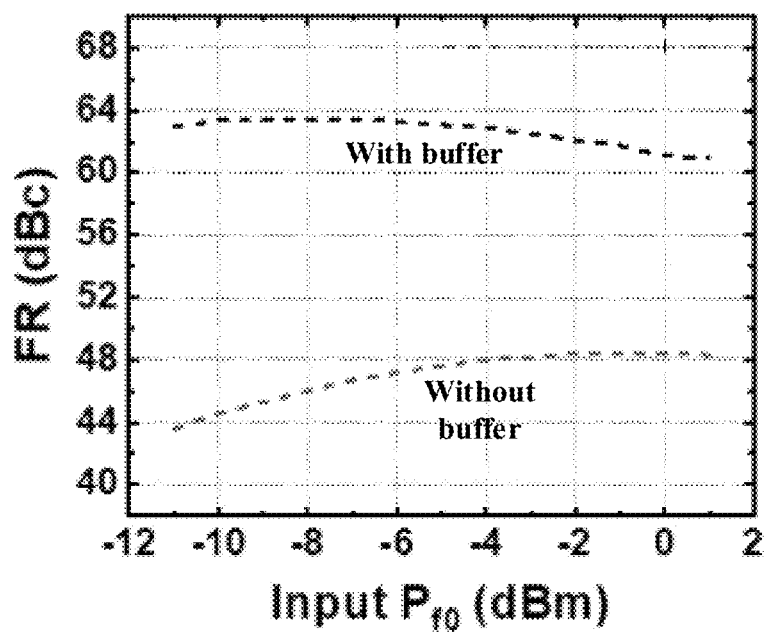
FIG. 14 shows a simulation of the fundamental suppression effect of the frequency doubler under different input power.

In some examples, the frequency doubler of the present invention can be fabricated using 65 nm CMOS process. The input signal and output signal are single-ended signals through two GSG pads. The die of the test chip is shown in FIG. 12, and the total area of the chip is 0.43 mm×0.08 mm. The core area is 0.15 mm×0.08 mm. The chip is glued to the PCB for testing while the input signal and output signal are provided by probes. The DC power and bias signals are provided through bonded wires. The core module includes a first differential amplifier circuit and a second differential amplifier circuit. The buffer includes an output load circuit and an output balun circuit. FIGS. 13A-13B show a diagram of the test platform. FIG. 13A is to test the output power of the frequency doubler with the help of a V-band harmonic mixer and FIG. 13B is to test the output power of the fundamental wave. The fundamental suppression (FR) is calculated in with the help of data measured in FIG. 13A. According to the datasheet of cables, the typical loss of 1-m 67 GHz cables are 4 dB at 30 GHz and 6 dB at 60 GHz, while 0.2-m 110 GHz cables have a loss of 1.5 dB at 60 GHz. Therefore, the input power of a 0-dBm doubler is equivalent to the 4-dBm signal generated from the corresponding signal generator. However, when the equivalent input power of doubler is 0-dBm, the spectrum analyzer shows only a noise floor of −60 dBm during testing in FIG. 10B. This indicates that the fundamental power from the output buffer is less than −60 dBm and is submerged under the noise floor of signal analyzer. Therefore, the fundamental rejection results of the core doubler and the doubler with buffer are provided by the simulation results shown in FIG. 14. The simulated fundamental rejection at the 33 GHz input are better than 43.6 dBc and 61 dBc, respectively.

Figure 15:
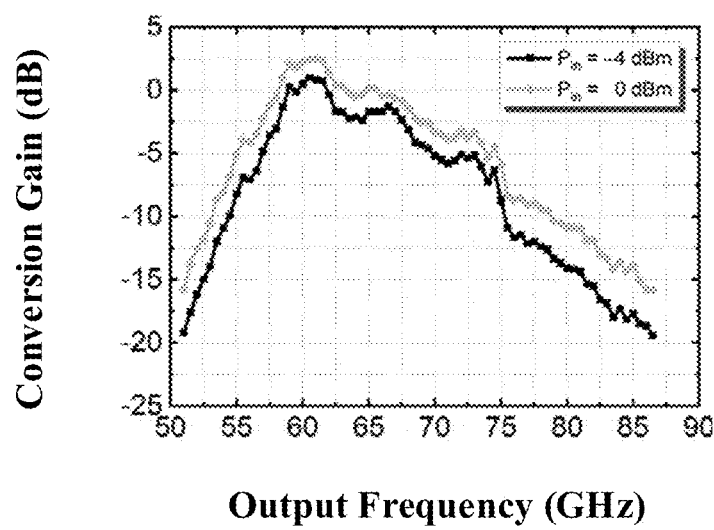
FIG. 15 shows a simulated conversion gain versus output frequency of the doubler.
Figure 16:
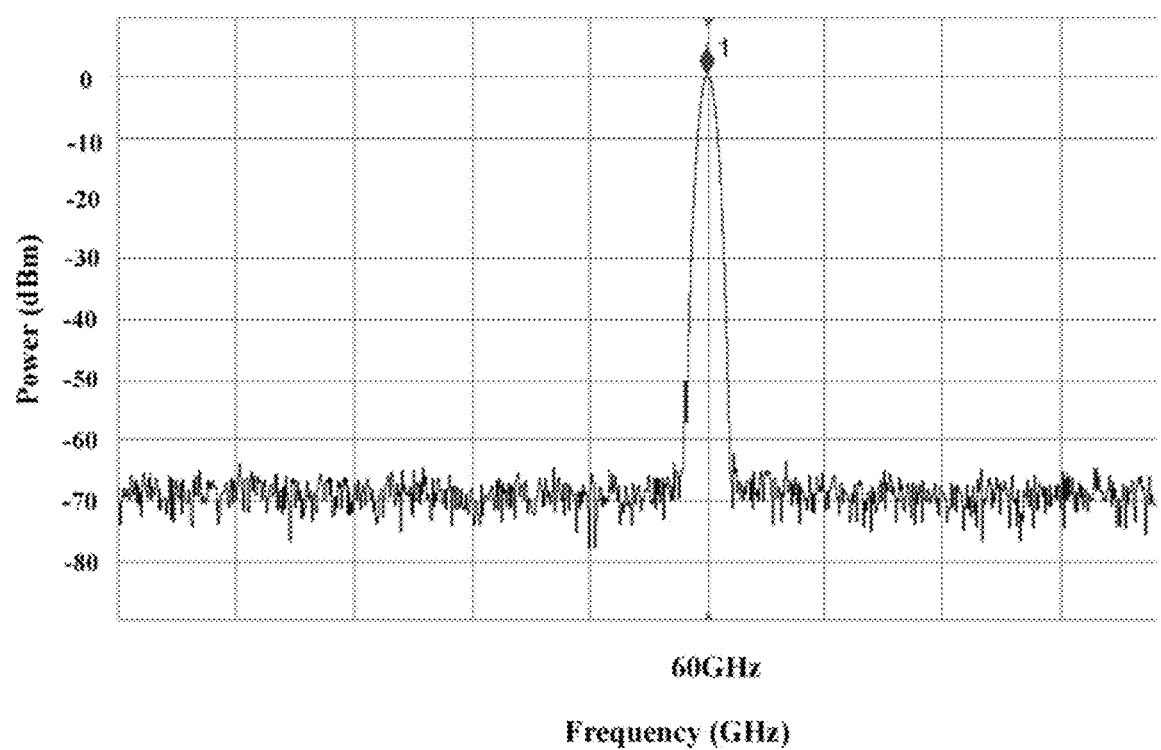
FIG. 16 shows a simulated spectrum of the output signal of the doubler.
Figure 17:
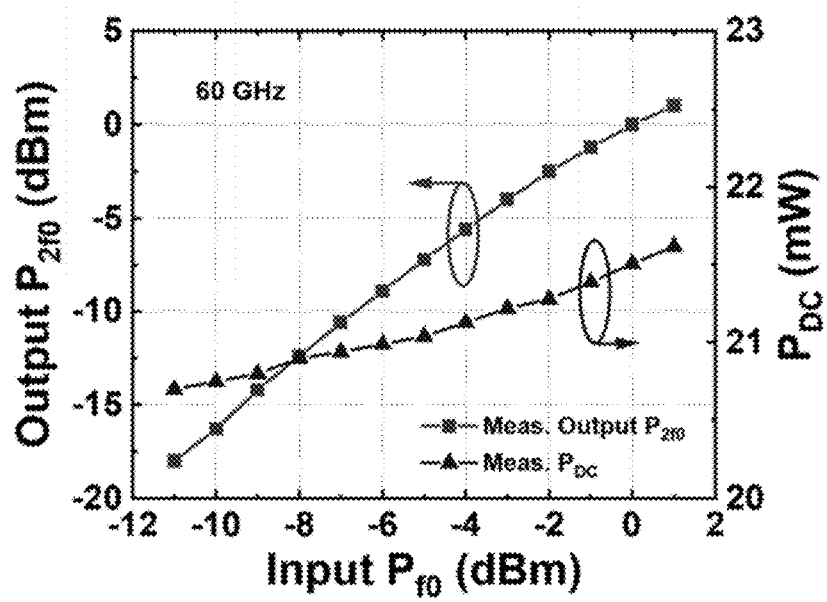
FIG. 17 shows a simulated second harmonic power and DC power consumption versus input power of the frequency doubler.

FIG. 15 shows the conversion gain of doubler measured at 30 GHz input with an equivalent 0-dBm and −4 dBm. At 30 GHz, 0-dBm input, the doubler outputs 0 dBm and the conversion gain is 0 dB (line loss in output testing is not considered). At 30 GHz and −4-dBm inputs, the doubler outputs −5.7 dBm and has a conversion gain of −1.7 dB. The −3-dB bandwidth ranges from 58 GHz to 66.5 GHz (13.7%). FIG. 16 shows the measured spectrum of the 60 GHz output of the doubler at 30 GHz, 0-dBm input. FIG. 17 shows the measured output second harmonic power and DC power dissipation (including drive) vs. input power of doubler at 30 GHz input. At a 1-V supply and 0 dBm input, the overall DC power consumption is 21.5 mW while the core power is only 2.5 mW.

Figure 18:
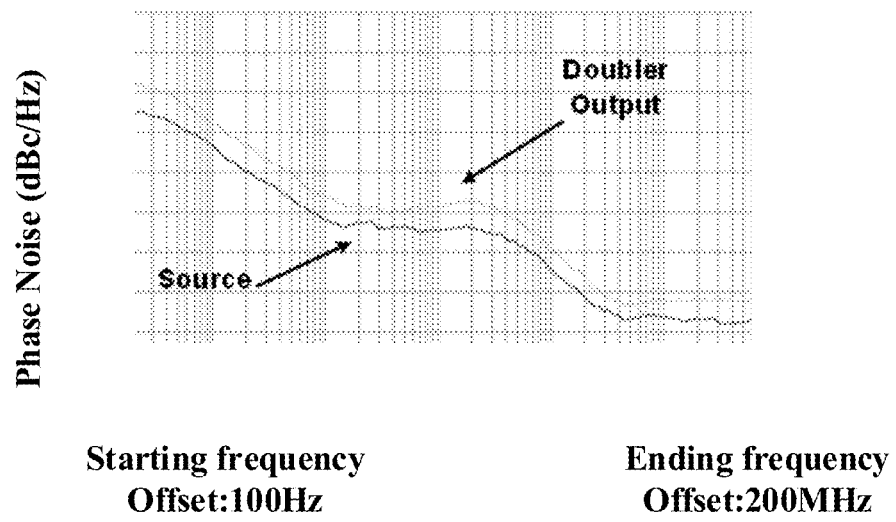
FIG. 18 shows a simulated of the input phase noise and output phase noise of the doubler.

The tested input and output phase noise of the doubler is shown in FIG. 18. Driven by a signal source of high spectral purity (Keysight PSG E8257D), the output phase noise of doubler is 6 dB higher than the input phase noise (this is the minimum theoretically expected value of frequency multiplied by 2). The test frequency offset ranges from 100 Hz to 200 MHz.

The performance of the frequency doubler provided in the example of the present invention is compared with some other frequency doublers. In specifications, the inventor also adds a power efficiency 11, and the calculation method is given by the following equation:

$$\eta(\%) = 100 \times \frac{P_{out,2nd}(mW)}{P_{in,1st}(mW) + P_{dc}(mW)},$$

where $P_{out,2nd}$ (mW) is output second harmonic power. $P_{in, 1st}$ (mW) is the power of the input signal. $P_{dc}$(mW) is DC power dissipation.

Table 1 lists the performance summary comparison of the doublers. In Table 1, the core doubler provided in the example of the present invention exhibits a good conversion gain of −0.1 dB at a 0-dBm input. The core power consumption is only 2.5 mW, and the corresponding efficiency can reach 27.9%. In addition, the 0.012 mm² core area makes the doubler easy to integrate into modern transceiver systems. Even when the output buffer is considered, the doubler is still more efficient than other doublers and achieves a maximum conversion gain of up to 1.5 dB at 0-dBm input.

The examples of the present invention use the output signal phase information of basic NMOS and PMOS PP doubler and combine it with current reuse technology to increase the output power of the frequency doubler and reduce DC power consumption, and improve the conversion gain. The use of transformer produces balanced output differential signal which is easier to drive high performance mixers. Compared to the existing PP doubler, the present invention example only increases a small amount of area due to additional small transistors, capacitors and resistors.

TABLE 1

| | This Invention | Ref. 7 | Ref. 17 | Ref. 18 | Ref. 19 | Ref. 20 | Ref. 21 |
|---|---|---|---|---|---|---|---|
| Tech. | 65 nm CMOS | 800 nm SiGe HBT | 22 nm FDSOI | 90 nm CMOS | 130 nm SiGe: C HBT | 90 nm CMOS | 90 nm CMOS |
| Method | Complementary push-push | Push-push | Push-push | Single transistor + Microstrip line | Gilbert cell | Push-push | Push-push |
| Output Frequency (−3 dB) (GHz) | 58-66.5 (13.7%) | 50-68 (30%) | 50-66 (27.6%) | 50-70 (33.3%) | 55-75 (30.8%) | 42-90 (72.7%) | 51-64 (22.6%) |
| Conversion Gain (dB) @ Input Power (dBm) | −0.1/1.5*@0 | −1.6@0 | −8.2*@0 −5.7*@−5 | −11@0 | 0.3@0 | −8@5 | −5.5@−2 |
| Fundamental Rejection (dBc) | ≥43.6#/61*# | ≥13 | ≥35* | ≥10 | ≥25 | 20-48 | 16.3-29 |
| VDD (V) | 1 | 4 | 1 | 1.5 | 2.5 | 1 | 1 |
| DC Power (mW) | 2.5/21.5* | 156 | 16* | 4.5 | 50 | 20 | 15.9 |
| Efficiency η (%) | 27.9/6.3* | 0.44 | 1.66 | 1.44 | 2.1 | 2.16 | 1 |
| Core Area (mm²) | 0.012 | N.A. | <0.033 | N.A. | 0.019 | N.A. | N.A. |
| Total Area (mm²) | 0.19 | 0.22 | 0.135 | 0.4 | 0.25 | 0.33 | 0.69 |

*With buffer. #Simuated value.

Therefore, there is a great potential for it to be integrated in high performance transceiver systems.

The present document refers to various examples to illustrate. However, the skilled in the art will recognize that examples can be changed and modified without departing from the scope of the present document. For example, various operating steps and components for performing operational steps can be implemented in different ways according to a particular application or consideration of any number of cost functions associated with the operation of the system (e.g., one or more steps may be deleted, modified or incorporated into other steps).

Although the principles of this document have been shown in various examples, many structures, arrangements, proportions, elements, materials and components modified in particular to specific environments and operating requirements can be used without departing from the principles and scope of this disclosure. The above modifications and other changes or amendments will be included in the scope of this document.

The present document refers to various examples to illustrate. However, the skilled in the art will recognize that examples can be changed and modified without departing from the scope of the present document. Therefore, the consideration of this disclosure will be illustrative rather than restrictive, and all such modifications will be included within its scope. Similarly, for advantages of various examples, other advantages and solutions to the problem have been described above. However, none of the benefits, advantages, solutions to the problem, or any of the elements that produce them, or make them clearer, should not be interpreted as critical, necessary, or necessary. The term "includes" and any other variation is non-exclusive inclusion. The process, method, article, or device are not only included, but also other elements that are not explicitly listed or that are not part of the process, method, system, article, or device. Furthermore, the term "coupling" used and any other variation refers to a physical connection, an electrical connection, a magnetic connection, an optical connection, a communication connection, a functional connection, and/or any other connection.

The present document refers to various examples to illustrate. However, the skilled in the art will recognize that examples can be changed and modified without departing from the scope of the present document. Accordingly, the scope of the present invention should be determined in accordance with the following claims.

What is claimed is:

1. A push-push doubler based on a complementary transistor, comprising a first differential amplifier circuit, a second differential amplifier circuit and an output load circuit;

the first differential amplifier circuit is for receiving a differential input signal with an initial frequency, and amplifies an amplitude of a second harmonic of the differential input signal with the initial frequency to obtain a first signal;

the second differential amplifier circuit is for receiving the differential input signal with the initial frequency, and amplifies the amplitude of the second harmonic of the differential input signal with the initial frequency to obtain a second signal; wherein, the first signal and the second signal are differential signals with the same amplitude and a phase difference of 180°;

the output load circuit is used to extract the second harmonics from the first signal and the second signal, respectively to obtain a differential output signal having a first output frequency, and output the differential output signal with the first output frequency; wherein, the first output frequency is twice of the initial frequency.

2. The push-push doubler according to claim 1, wherein the push-push doubler further comprises a voltage provider terminal; both the first differential amplifier circuit and the second differential amplifier circuit consist of a plurality of transistors;

the voltage provider terminal is used to provide a driving current to the plurality of transistors in the first differential amplifier circuit and the second differential amplifier circuit.

3. The push-push doubler according to claim 2, wherein the plurality of transistors have the same type in the first differential amplifier circuit; the plurality of transistors also have the same type in the second differential amplifier circuit; the type of the plurality of transistors in the first differential amplifier circuit is different from the type of the plurality of transistors in the second differential amplifier circuit.

4. The push-push doubler according to claim 2, wherein the first differential amplifier circuit consists of a first transistor, a second transistor, a first capacitor, a second capacitor, a first resistor and a second resistor;

a control pole of the first transistor receives a third signal by the first resistor; a second pole of the first transistor is grounded; a first pole of the first transistor is connected to a first pole of the second transistor; the control pole of the first transistor is also connected to one end of the first capacitor; the other end of the first capacitor is used to receive one path signal in the differential input signal with the initial frequency; a control pole of the second transistor receives the third signal by the second resistance; a second pole of the second transistor is grounded; the control pole of the second transistor is also connected to one end of the second capacitor; the other end of the second capacitor is used to receive another path signal in the differential input signal with the initial frequency; the first pole of the first transistor is also connected to the output load circuit, which is used to output the first signal.

5. The push-push doubler according to claim 4, wherein the first transistor and the second transistor are both NMOS transistors.

6. The push-push doubler according to claim 4, wherein the second differential amplifier circuit consists of a third transistor, a fourth transistor, a third capacitor, a fourth capacitor, a third resistor and a fourth resistor;

a control pole of the third transistor receives a fourth signal by the third resistor; a first pole of the third transistor is connected to the voltage provider terminal; a second pole of the third transistor is connected to a second pole of the fourth transistor; the control pole of the first transistor is also connected to one end of the third capacitor; the other end of the third capacitor is used to receive the one path signal in the differential input signal with the initial frequency; a control pole of the fourth transistor receives the fourth signal by the fourth resistance; a first pole of the fourth transistor is connected to the first pole of the third transistor; the second pole of the fourth transistor is connected to the output load circuit, which is used to output the second signal;

the control pole of the fourth transistor is connected to one end of the fourth capacitor; the other end of the fourth capacitor is used to receive the another path signal in the differential input signal with the initial frequency.

7. The push-push doubler according to claim 6, wherein the third transistor and the fourth transistor are both PMOS transistors.

8. The push-push doubler according to claim 6, wherein the first output frequency is 58-66.5 GHz.

9. The push-push doubler according to claim 8, wherein the first transistor and second transistor have a width of 16 μm and a length of 60 nm; the third transistor and fourth transistor have a width of 48 μm and a length of 60 nm.

10. The push-push doubler according to claim 1, wherein the output load circuit consists of a first inductor; one end of the first inductor is for receiving the first signal and the other end of the first inductor is for receiving the second signal.

11. The push-push doubler according to claim 1, wherein the output load circuit consists of a first transformer and a common source amplifier;

the first transformer is used to balance the first signal output from the first differential amplifier circuit and the second signal output from the second differential amplifier circuit, and output to the common source amplifier, respectively;
the common source amplifier is used to amplify the first signal and the second signal after a phase balance of the first transformer and output them.

12. The push-push doubler according to claim 11, wherein the common source amplifier consists of a fifth transistor and a sixth transistor; a control pole of the fifth transistor is for receiving one path signal output from the first transformer; the control pole of the fifth transistor is also connected via a fifth capacitor to a first pole of the sixth transistor; a second pole of the fifth transistor is grounded; a control pole of the sixth transistor is used to receive another path signal output from the first transformer; the control pole of the sixth transistor is also connected to a first pole of the fifth transistor through a sixth capacitor; the first pole of the fifth transistor and the first pole of the sixth transistor are connected to two ends of a second inductor, respectively; the two ends of the second inductor are used to output the differential output signal.

13. The push-push doubler according to claim 1, wherein the push-push doubler further has an input balun circuit and an output balun circuit;

the input balun circuit is for converting a received single-ended input signal into the differential input signal;
the output balun circuit is for converting the differential output signal from the output load circuit into a single-ended output signal, and output the single-ended output signal.

14. The push-push doubler according to claim 13, wherein the input balun circuit consists of a second transformer; a primary coil of the second transformer is a third inductor while a secondary coil is a fourth inductor; the third inductor and the fourth inductor are coupled with each other; one end of the third inductor is for receiving the single-ended input signal, and the other end of the third inductor is grounded; both ends of the fourth inductor are used to output two differential input signals.

15. The push-push doubler according to claim 13, wherein the output balun circuit consists of a third transformer; a primary coil of the third transformer is a fifth inductor while a secondary coil is a sixth inductor; the fifth inductor and the sixth inductor are coupled with each other; both ends of the fifth inductor are connected to the output load circuit to receive differential output signals; one end of the sixth inductor is used to output the single-ended output signal, and the other end of the sixth inductor is grounded.

* * * * *